Figure 3A:
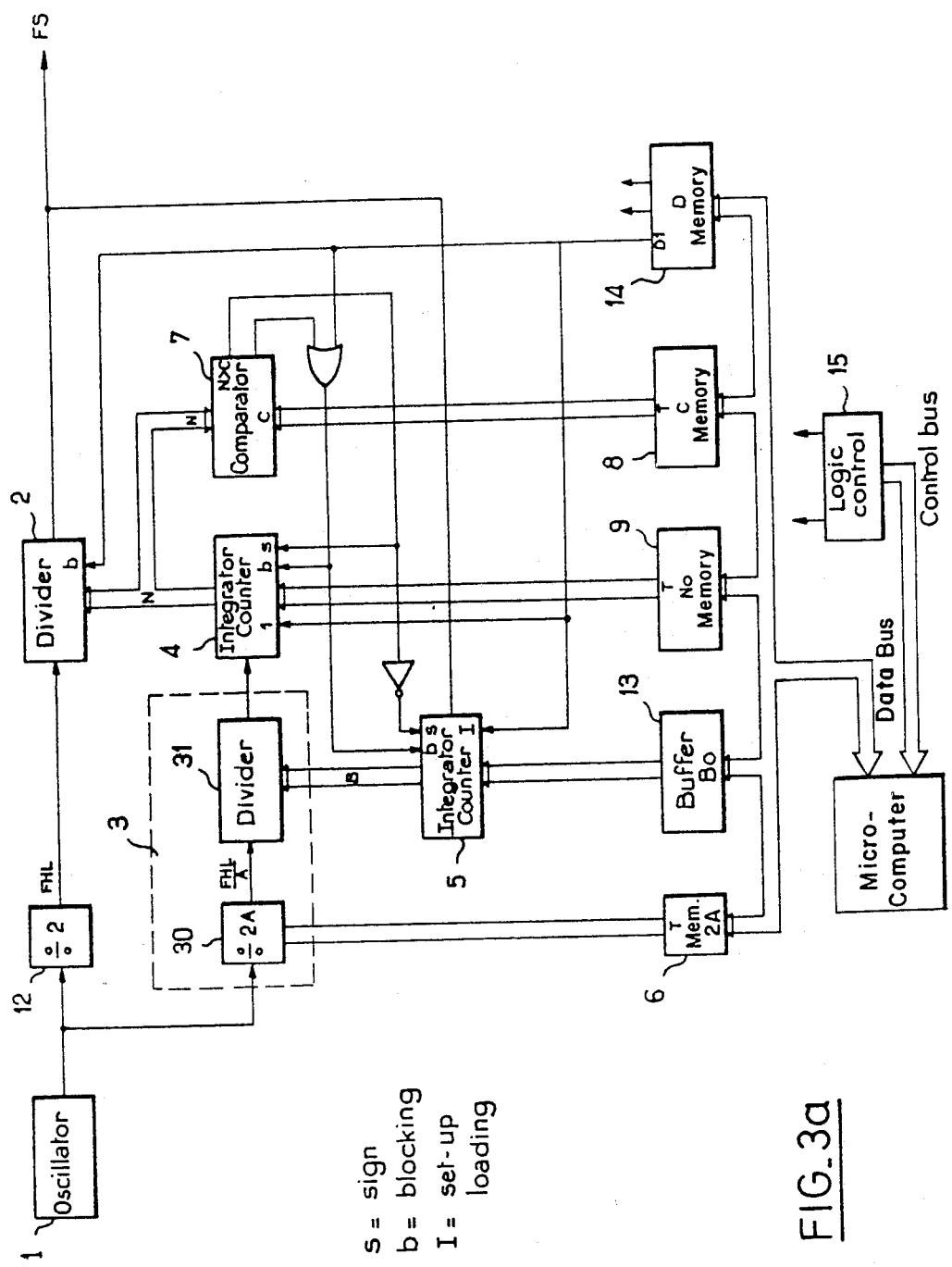

United States Patent [19]
Pelletier

[11] Patent Number: 4,870,366
[45] Date of Patent: Sep. 26, 1989

[54] SIGNAL GENERATOR WITH PROGRAMMABLE VARIABLE FREQUENCY

[75] Inventor: Charlie Pelletier, Massy, France

[73] Assignee: Societe De Fabrication D'Instruments De Mesure (S.F.I.M.), France

[21] Appl. No.: 65,560

[22] Filed: Jun. 23, 1987

[30] Foreign Application Priority Data

Jun. 25, 1986 [FR] France .................................. 86 09193

[51] Int. Cl.$^4$ ........................ H03K 5/00; H03B 19/00; G06M 3/00; G06F 7/52
[52] U.S. Cl. ..................................... 328/140; 328/142; 328/14; 377/52; 364/703
[58] Field of Search ............... 328/140, 142, 144, 143, 328/145, 14; 377/52; 364/703; 307/490, 494; 318/685

[56] References Cited

U.S. PATENT DOCUMENTS

| | | | |
|---|---|---|---|
| 3,548,320 | 12/1970 | Roberts et al. | 377/45 |
| 3,566,096 | 2/1971 | Schultheis | 364/703 |
| 4,103,216 | 7/1978 | Haynes | 318/685 |
| 4,450,532 | 5/1984 | Massey | 328/144 |
| 4,560,960 | 12/1985 | Chanrion | 377/52 |

FOREIGN PATENT DOCUMENTS

| | | |
|---|---|---|
| 0088669 | 9/1983 | European Pat. Off. . |
| 2576470 | 7/1986 | France .................................. 377/52 |
| 54-85091 | 7/1979 | Japan . |

OTHER PUBLICATIONS

Electronics Letters, J. J. Hill et al. Digital Method of Sweep Frequency Generation, Nov. 1982 (Great Britain), vol. 18, No. 23, pp. 1017-1019.
Dewent Publication, Polynomial Frequency Series Synthesizer, etc., SU-R2, Week B05, B0075B/05-SU-596-954.

*Primary Examiner*—Stanley D. Miller
*Assistant Examiner*—Trong Quang Phan
*Attorney, Agent, or Firm*—Mason, Kolehmainen, Rathburn & Wyss

[57] ABSTRACT

The invention relates to a signal generator with programmable variable frequency and comprises a reference oscillator, a first frequency divider receiving the signal emitted by the reference oscillator and delivering an instantaneous frequency signal (FS). A control chain for said first frequency divider comprises a second frequency divider and a first programmable integrator system, which controls the first frequency divider. A control chain for the second frequency divider comprises a second integrator system receiving the output signal (FS). This signal has an instantaneous frequency of the polynomial form $$FS = \sum_{j=0}^{n} K_j t^j.$$

14 Claims, 5 Drawing Sheets

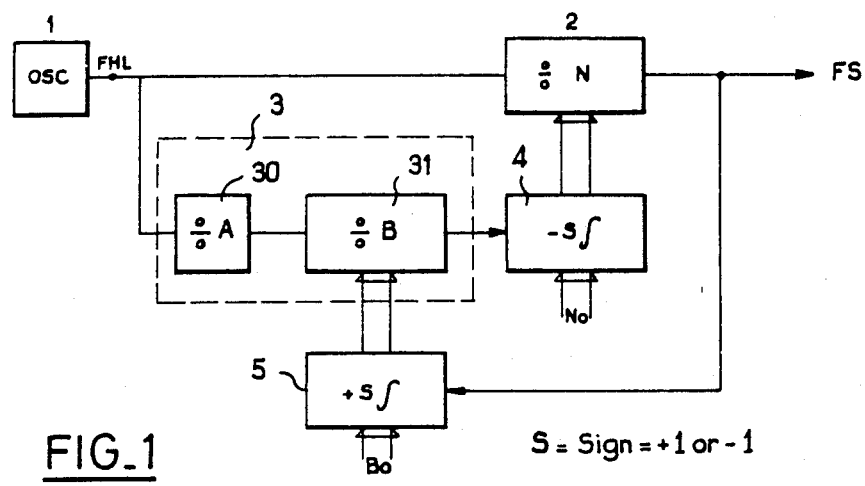
FIG_1
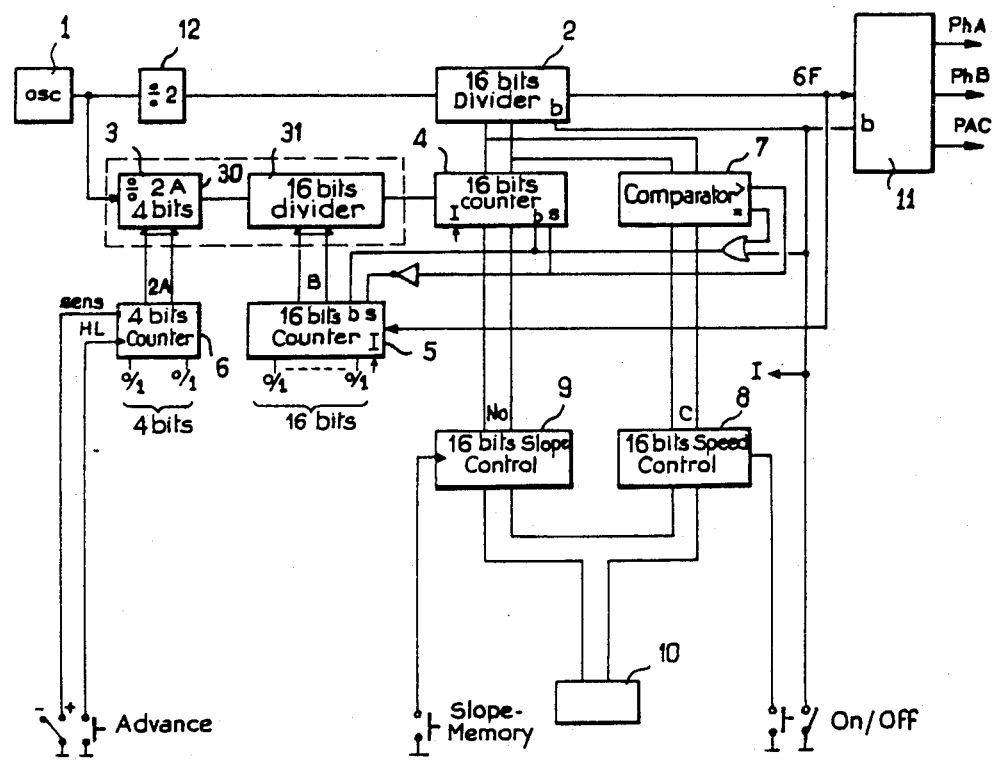
FIG_2

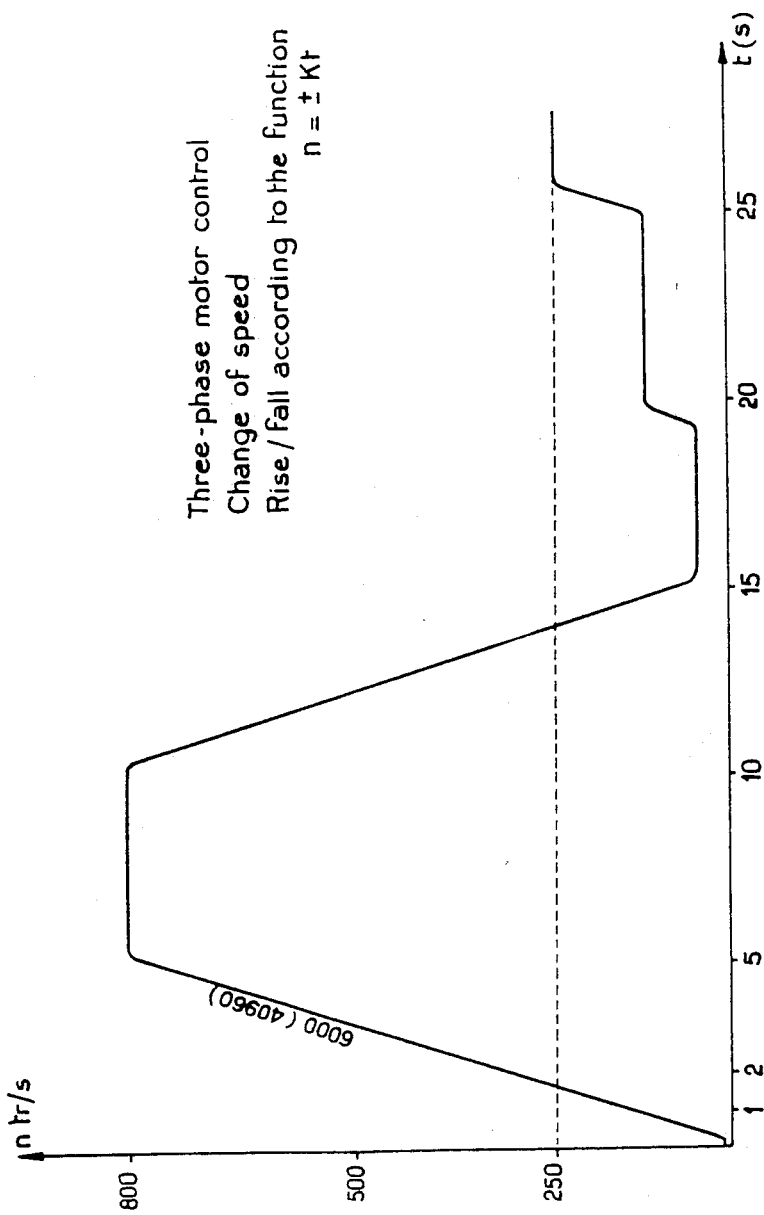
FIG_3d

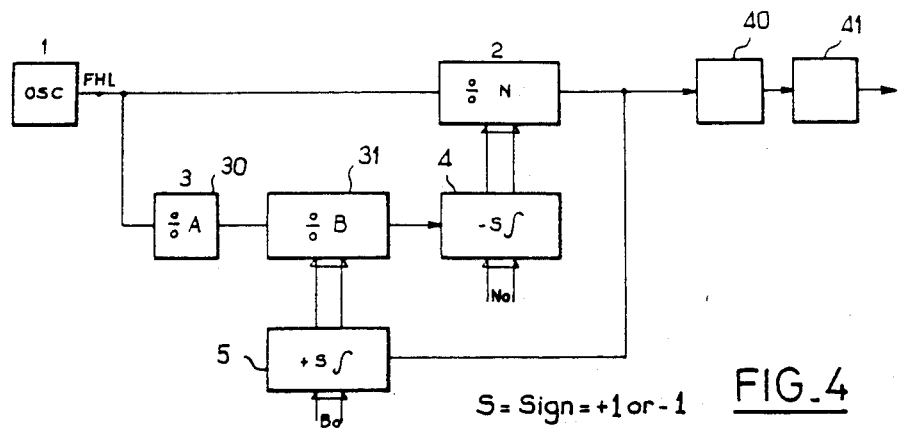
FIG_4  S = Sign = +1 or -1
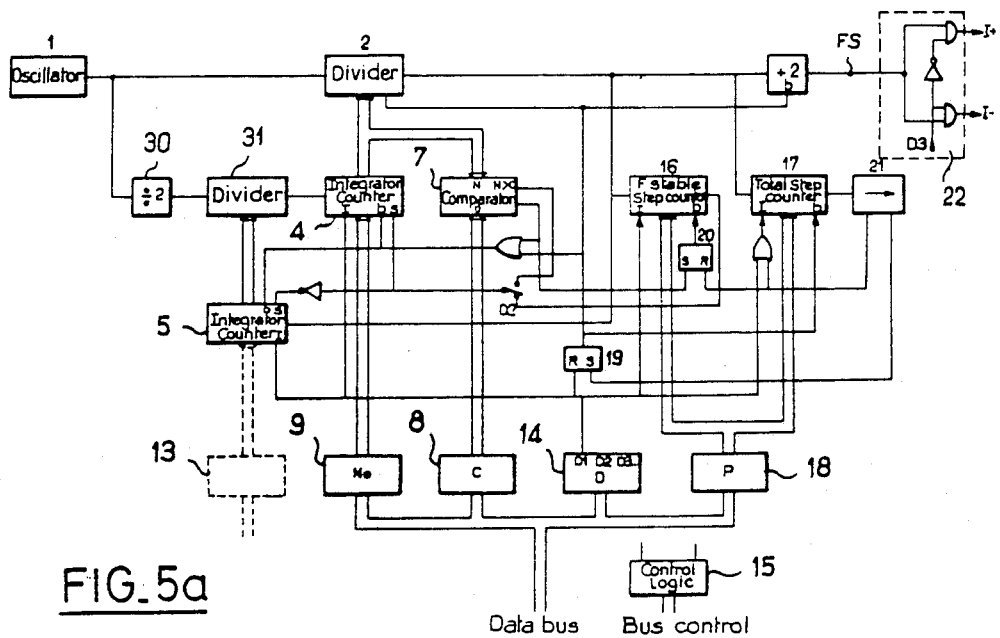
FIG_5a
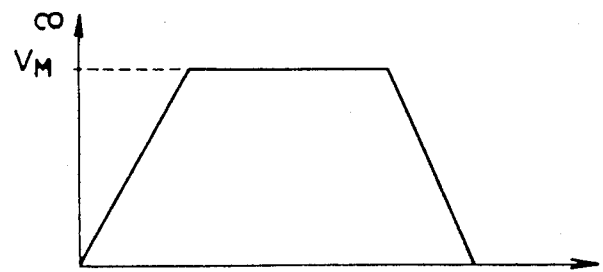
FIG_5b

SIGNAL GENERATOR WITH PROGRAMMABLE VARIABLE FREQUENCY

FIELD OF THE INVENTION

The invention relates to a signal generator with programmable variable frequency, the frequency variation law being a law based on a polynomial of time.

Signal generators with programmable variable frequency have up to now been the subject of numerous works.

BACKGROUND OF THE INVENTION

One of the solutions employed because of its direct character consists of using a programmable frequency divider on the frequency given by a signal generator, this divider being able to be directly controlled by a sequencer or a calculator. This type of solution, while it permits the effective obtaining of frequency variation laws corresponding to those pre-established by the program, has however the inherent inconvenience to systems controlled by program, which, most often, do not permit processing in real time, the calculation times of the programs, as a function of the desired applications, can become very significant for obtaining a response of the system and a corresponding frequency variation in real time. Further, the highly discrete character of the number of values of division ratios able to be used in the programmable divider used permits establishment of only certain predetermined frequency variation laws, laws corresponding to discrete variations of frequency, any continuous variation between the mentioned discrete values being excluded with as a result a corresponding absence of continuous variation between elementary frequency values constituting a programmed law.

THE INVENTION

The present invention has the object of remedying the mentioned inconveniences by providing a signal generator with programmable variable frequency according to a time polynomial law.

Another object of the present invention is to provide a signal generator with programmable variable frequency being able to generate very high frequency values.

Another object of the present invention is to provide a signal generator with programmable variable frequency permitting the establishment of a law of frequency variation which is continuous as a function of time, the variation law being able to consist of a plurality of successive elementary variation laws.

Another object of the present invention is also the provision of a signal generator with programmable variable frequency in the form of an integrated circuit, the integrated circuit being able to constitute a peripheral element of the central unit of a computer, of a calculator or of a microcomputer.

The signal generator with variable frequency programmable according to a time polynomial law, according to the invention, is remarkable in that it comprises a reference oscillator permitting generation of an arbitrary frequency reference signal. A first frequency divider with a controlled division ratio receives the arbitrary frequency reference signal and delivers in use an output signal of given instantaneous frequency. A control chain for the first frequency divider fed by the reference oscillator comprises, connected in cascade, a second frequency divider with a controlled division ratio and a first programmable integrator system, of which the output delivers to the first frequency divider the value of the instantaneous division ratio. A control chain of the second frequency divider comprises a second integrator system receiving the output signal and delivers the instantaneous division ratio to the second divider at controlled division ratio. The first and second integrator systems carry out a magnitude integration at a sign opposite to their input signals. The output signal thus has an instantaneous frequency of the polynomial form:

$$FS = \sum_{j=0}^{n} K_j t^j.$$

The invention finds application in any system employing the synthesis of frequencies, radio-electric emission in electromagnetic detection techniques, automatic control of electric motors and particularly robotics, any technique in which the establishment of more and more precise and diverse control laws for motors is necessary.

THE DRAWINGS

Figure 3B:
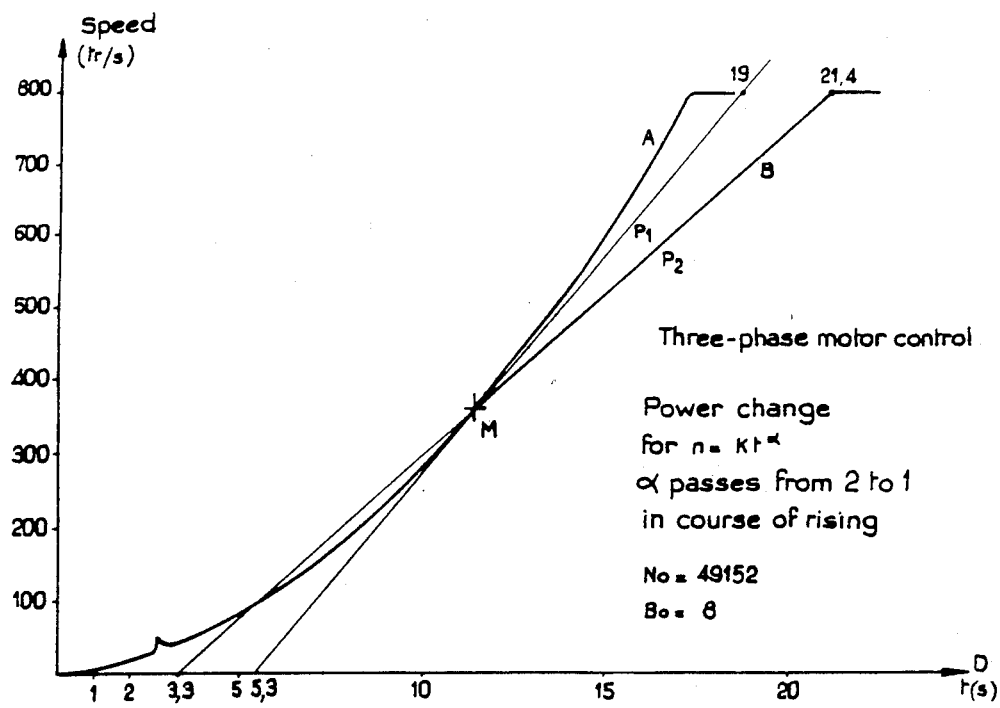
Figure 3C:
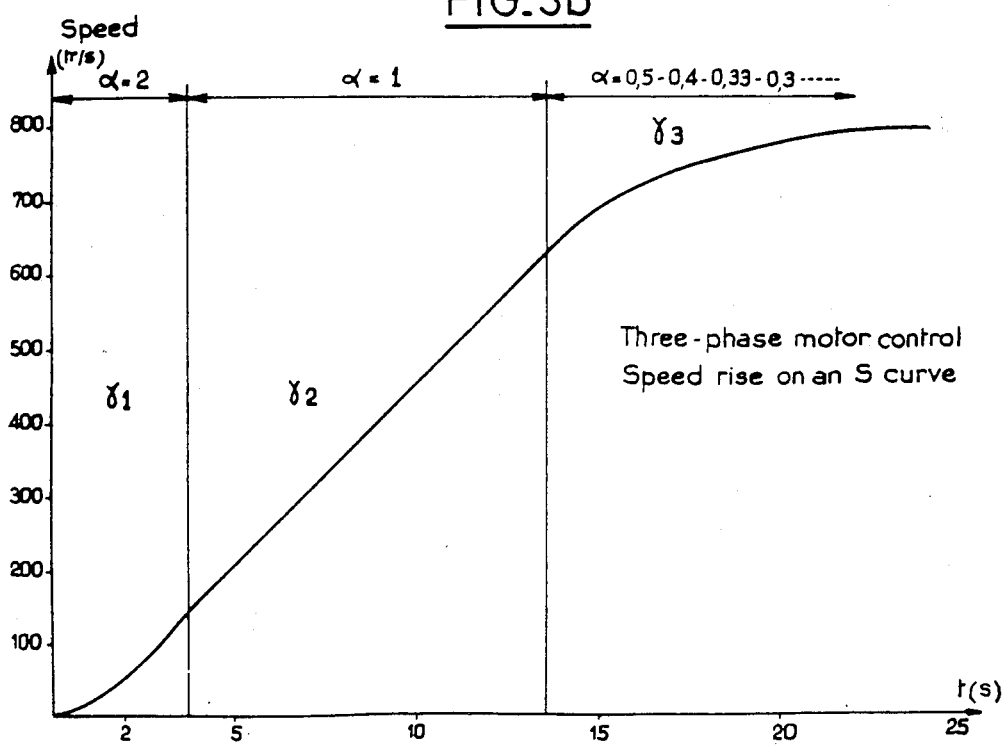

The invention will be better understood from reading the following description and the accompanying drawings, in which:

FIG. 1 shows a block diagram of a signal generator device with a variable frequency programmable according to a time polynomial law, according to the present invention, FIG. 2 shows an advantageous non-limitative embodiment of the signal generator such as shown in FIG. 1, FIG. 3a shows a diagram of a signal generator according to the invention, more particularly adapted for use in the control of a motor such as a synchronous motor and FIGS. 3b, 3c, 3d show different control laws for the speed of a motor obtained by means of a signal generator such as shown in FIG. 3a, FIG. 4 shows a diagram of a signal generator, according to the invention, more particularly adapted to generate sinusoidal wave forms, FIG. 5a shows a diagram of a signal generator according to the invention, more particularly adapted for the control of stepper motors, and FIG. 5b shows a speed control curve for the stepper motor able to be provided by means of the signal generator such as shown in FIG. 5a.

THE FIRST EMBODIMENT

The signal generator with variable frequency programmable according to a time polynomial law, according to the invention, will now be described in connection with FIG. 1.

In FIG. 1, the signal generator device with programmable variable frequency permits obtaining a variation law for the frequency FS of the output signal according to a time polynomial law. By time polynomial law for the frequency FS of the output signal is intended a frequency law of the form $$FS = \sum_{j=0}^{n} K_j t^j,$$

in which t represents the time from an arbitrary time origin and Kj the coefficients of each monomial of degree j, the coefficients Kj being determined as a function of the set-up parameters of the signal generator as will be described below in the description.

As appears in FIG. 1, the signal generator comprises a reference oscillator designated 1, generating a reference signal of an arbitrary frequency FHL. A first frequency divider, designated 2, with a controlled division ratio N receives the arbitrary frequency reference signal FHL and delivers in use an output signal of instantaneous frequency FS. The output signal of the first divider 2 constitutes the output signal of the signal generator of the invention. A control chain for the first frequency divider 2 is fed by the reference oscillator 1 and comprises, connected in cascade, a second frequency divider 3 with a controlled division ratio and a first programmable integrator system 4, of which the output delivers to the first frequency divider 2 the valve of the instantaneous division ratio N.

A second control chain of the second frequency divider 3 comprises a second integrator system 5 receiving the output signal of instantaneous frequency FS and delivers the instantaneous division ratio to the second divider 3 at the controlled division ratio. The first 4 and second 5 integrator systems carry out magnitude integration at opposite sign, the sign of the integration being designated S with $S = \pm 1$, of their input signals. Thus, the first 4 and second 5 integrator systems have at each instance a transfer function designated $-S\int$ and $+S\int$ or reciprocally as designated in FIG. 1. The first 4 and second 5 integrator systems are able to permit to the origin of the time parameter t a setting-up value of the division ratios N and B for the first and second frequency dividers 2,3 to values No and Bo respectively.

According to a particularly advantageous non-limitative embodiment of the signal generator according to the invention, the reference oscillator 1 can be constituted by a pulse generator with a fixed, quartz controlled, recurrence frequency. The first 4 and second 5 integrator systems can then be constituted by up and down pulse counters.

In the same way, the first 2 and second 3 frequency dividers with a controlled division ratio can be constituted by programmable delay circuits and, advantageously, by controlled binary logic circuits ensuring in use their respective instantaneous division ratio N,B, the division corresponding to the number of pulses of their input signal, as will be explained in more detail below in the description.

According to a particularly advantageous non-limitative embodiment, shown in FIG. 1, particularly, the second divider 3 comprises, connected in cascade, a first frequency divider 30 with a division ratio A adjustable, independently of the second control chain and a second frequency divider 31 with a division ratio controlled by the second control chain constituted by the second integrator system.

The operation of the signal generator as shown in FIG. 1 can be described in the following manner.

The reference oscillator 1 generates pulses at a recurrence reference frequency FHL. The first frequency divider 2 delivers the output signal with an instantaneous frequency FS=FHL/N relation in which N is the instantaneous value of the division ratio of the first divider 2. The second frequency divider 3, constituted by the two dividers in cascade 30 and 31 delivers at its output an instantaneous frequency fi=FHL/(A•B) relation in which B represents the instantaneous value of the division ratio of the divider 31. The first integrator system 4 permits in use for the value of S, $S = \pm 1$ to carry out a positive or negative integration of pulses from an initial value No. The first integrator system 4 constituted by an integrating counter as previously described permits carrying out of counting up or counting down of pulses received in use from the value of the sign parameter S. The first integrator system 4 delivers the instantaneous value of the division ratio N to the first divider 2.

The second integrator system 5 also carries out as a function of the value of the sign parameter S a negative or positive integration of pulses from an initial value Bo. It thus carries out a counting down or counting up of pulses constituted by the frequency of the output signal FS and delivers the instantaneous value of the division ratio B to the second divider 3, more particularly to the programmable divider 31. The different transfer functions of the constituent elements of the signal generator according to the invention shown in FIG. 1, are written:

$$B = S \int FS \, dt$$

and the signal delivered by the second divider 3 and more particularly by the divider 31 is written:

$$Fi = \frac{FHL}{AB} = \frac{FHL}{A \cdot S \int FS \, dt}$$

The division ratio N of the first divider 2 is written:

$$N = -S \int Fi \, dt = -\int \frac{FHL}{A \int FS \, dt} \, dt$$

and the frequency FS of the output signal is written:

$$FS = \frac{FHL}{N} = \frac{FHL}{-\int \frac{FHL}{A \int FS \, dt} \, dt}$$

$$FS = \frac{-1}{\int \frac{1}{A \int FS \, dt} \, dt}$$

For a frequency FS of the form $$FS = K_n t^n \quad \int FS \, dt = K_n \frac{t^{n+1}}{n+1} \text{ and}$$

$$\int \frac{1}{A \int FS \, dt} = \frac{n+1}{AK_n} \int \frac{1}{t^{n+1}} \, dt = -\frac{n+1}{nAK_n} \cdot \frac{1}{t^n}$$

$$\text{and } FS = K_n t^n = \frac{-1}{-\frac{n+1}{nAK_n} \cdot \frac{1}{t^n}} = \frac{nAK_n}{n+1} t^n$$

The value of the degree n of the monomial of order n is determined in such manner that $nA/(n+1) = 1$ and the corresponding degree n satisfies the relation: $n = A/(A-1)$.

For $A = 1$, the frequency FS of the output signal is $FS = Ke^t$, the value of K being fixed by the passage of the representative curve of the variation law through a point which can be the first point.

Thus, from the principle of superposition of the physical equilibrium states, the frequency FS of the output signal is an instantaneous frequency of the form $$FS = \sum_{j=0}^{n} K_j i^j$$

as a function of the value of the parameters A, Bo, No of the signal generator according to the invention.

The signal generator such as described in FIG. 1 and FIG. 2 particularly, in fact permits the obtaining of a variation of the frequency FS of the output signal according to discrete values, the variation law comprising a succession of points constituted in fact by the pulses delivered by the first divider 2, the instantaneous frequency FS of the output signal being defined as the reciprocal of the time which separates two pulses or consecutive points. In fact, the first frequency divider 2 is a generator programmed for the space between points: at each point or pulse delivered by the reference oscillator 1, it takes account of the instantaneous value N of the division ratio and reaches N pulses generated by the reference oscillator 1 for generating the following pulse constituting the output signal at frequency FS.

The points FSi of the curve or variation law of the output frequency FS are defined in the following manner, as a function of each instant ti $$FS_i = FHL/(N_i - 1)$$

where Ni represents the value of the division ratio N at the instant i of the first divider 2, and the slope Pi of the curve or variation law at the instant ti is written:

$$P_i = \frac{FS_i + 1 - FS_i}{N_i/FHL}$$

At the instant $t_o(t_i$ with $i=o)$ of starting of the signal generator according to the invention, the first and second dividers are set up at values No, A, Bo and the value of S is fixed. A study by iteration for $S=1$ and $Bo=1$ shows that the value of the division ratio Ni at the instant ti of the first divider 2 is written $$N_i = N_i - 1\left(1 - \frac{1}{i \cdot A}\right) =$$

$$N_o\left(1 - \frac{1}{A}\right)\cdot\left(1 - \frac{1}{2A}\right)\ldots\left(1 - \frac{1}{i \cdot A}\right)$$

which is $N_i = N_o \times \delta_i$ with $$\delta_i = \prod_{p=1}^{i} \left(1 - \frac{1}{p \cdot A}\right)$$

The expression i represents the frequency attenuation for the final pulse of the order I and $F_{i+1} = (FHL)/(N_i)$ at the instant $t_i + 1$.

Similarly, each instant of the order $i+1$ satisfies the relation:

$$t_{i+1} = (1/FHL)(N_o + N_1 + \ldots + N_i) = (N_o \gamma_i)/FHL$$

with $$\gamma = 1 + \delta_1 + \delta_2 + \ldots \delta_i$$

γi representing the discrete image of the integral of time.

The value of the coefficient K of the monomial of degree n can then be determined by $$F_{i+1} = K(t_i+1)^n \text{ with } n=1/(A-1)$$

$$F_i + 1 = 1 = \frac{FHL}{N_o\delta_i} = K\left[\frac{N_o}{FHL}\gamma_i\right]^n$$

and the mentioned coefficient K satisfies the relation $$K = \left(\frac{FHL}{N_o}\right)^{n+1} \cdot \frac{1}{\delta_i \gamma_i^n}$$

The expression $a_i = 1/(\gamma_i \gamma_i^n)$ tends towards a constant value $\alpha$ when i tends towards infinity for a given value of the division ratio A of the divider 30 and of n.

An example of the corresponding values of A, n and α is given by the following table.

| A | n | α |
|---|---|---|
| 1,5 | 2 | 2,13 |
| 2 | 1 | 1,57 |
| 3 | ½ | 1,28 |
| 4 | ⅓ | 1,19 |
| 5 | ¼ | 1,14 | with $K = \alpha\left(\frac{FHL}{N_o}\right)^{n+1}$

The slope of the curve or variation law at a point Pi of the order i of the instant ti is written $$P_i = \frac{F_i + 1 - F_i}{N_i/FHL} \text{ or } P_i = \frac{FHL^2}{N_o^2 \delta_i^2 \cdot i \cdot A}$$

In the case of a linear variation law of the frequency of the function of time, that is for $n=1$ and $A=2$, the slope is equal to K.

The expression $$1/\delta_i = \frac{2 \times 4 \times 6 \ldots \times 2i}{1 \times 3 \times 5 \times 7 \ldots \times (2i-1)}$$

and the expression $$\frac{1}{2i\delta_i^2} = \frac{2 \times 2 \times 4 \times 4 \ldots \times 2i - 2 \times 2i}{1 \times 3 \times 3 \times 5 \ldots (2i-1) \times (2i-1)} \text{ is}$$

a Wallis product tending towards $\pi/2$ for i tending towards infinity.

The slope P is written:

$$P = \left(\frac{FHL}{N_o}\right)^2 \times \frac{\pi}{2}$$

According to an advantageous characteristic of the signal generator according to the invention, the first frequency divider 30 can be constituted by a frequency divider with an adjustable division ratio, the valve of the division ratio A being controlled from an external control. It is thus possible to modify the value of the division ratio A in the course of operation, which has the effect of modifying, at a point considered, the radius of the curve of the law of frequency variation according to a time polynomial law at the point considered.

The modification of the value of the parameter A for example at a point of the order of i permits obtaining two values of different slopes as for example:

$$Pi - 1 = 1 \frac{FHL^2}{No^2 \delta i^2 - 1 \, A1 \times (i-1)} \quad Pi = \frac{FHL^2}{No^2 \delta i^2 \, A2 \times i}$$

The ratio $(Pi-1)/Pi$ is little different from $A2/A1$, this having the result that there exists an angular point more marked the larger the ratio $A2/A1$.

According to an advantageous characteristic of the signal generator according to the invention, the angular point can be suppressed. A first solution can consist in preserving to each point of the order $i-1$, i a product $A \times \delta i$ substantially constant. The constancy of the product $A \times \delta i$ can be obtained by temporary local modification of the value of the division ratio B of the integrator system 5.

Variant

According to a variant of the advantageous embodiment of the signal generator according to the invention, the modification of the slope in the absence of the angular point can, in a preferential manner, be obtained at least by control of the division ratio A by an external circuit constituted for example by an integrator circuit. In FIG. 2, the integrator circuit designated 6 is constituted by an integrator counter.

Further, on set-up of the signal generator according to the invention, it is possible to fix the value of Bo at a value greater than 1. In this case, everything behaves as if the frequency variation law as a function of time was occurring from a translated point.

The different values taken by N are the following:

$$No$$

$$N1 = No\left(1 - \frac{1}{ABo}\right)$$

$$N2 = No\left(1 - \frac{1}{ABo}\right)\left(1 - \frac{1}{A(Bo+1)}\right)$$

$$Ni = No\left(1 - \frac{1}{ABo}\right)\left(1 - \frac{1}{A(Bo+1)}\right) \ldots \times \left(1 - \frac{1}{A(Bo+i)}\right)$$

One can thus define a fictitious point $N'o$ such that $$No = N'o\left(1 - \frac{1}{A}\right)\left(1 - \frac{1}{2A}\right)\ldots\left(1 - \frac{1}{A(Bo-1)}\right)$$

In this case, the value of K is:

$$K' = a\left(\frac{FHL}{No'}\right)^{n+1} = a\left(\frac{\delta Bo - 1}{No} FHL\right)^{n+1}$$

and $$K' = \frac{1}{R} a\left(\frac{FHL}{No}\right)^{n+1} \text{ with } R = \frac{1}{\delta Bo - 1^{n+1}}$$

the table gives the value of the reduction coefficient R:

| Bo | n 2 | 1 | ½ |
|---|---|---|---|
| 1 | 1 | 1 | 1 |
| 2 | 27 | 4 | 1,84 |
| 3 | 91 | 7,11 | 2,41 |
| 4 | 193 | 10,24 | 2,88 |
| 5 | 334 | 13,375 | 3,28 |
| 6 | 514 | 16,5 | 3,64 |
| 7 | 732 | 19,65 | 3,97 |
| 8 | 988 | 22,8 | 4,27 |

This reduction coefficient is particularly efficacious when n is large.

From the first point, the curve described is such that the value of the frequency FS is given by $$FS = K'(t + to)^n$$

with $$to = 1/(FHL)(N'o + N'1 \ldots + N_{Bo-1})$$

The interest of the reduction coefficient is to be able to diminish the value of K when it is no longer possible to increase the initial value No because of the maximum capacity of the counters. For a given value No, there is an array of curves which pass through a point of fixed frequency $$FS_{MIN} = FHL/N_{oMAX}$$

This has the effect of increasing the rise time at the same frequency.

The direction of locus of the curve, that is to say the variation of the freqency of the output signal FS, is determined by the sign of S. The single fact, at a determined instance, of inverting the sign of S has the effect of inverting the direction of the locus and the variation of the frequency FS of the output signal.

In the diagram of FIG. 2, there have been shown different constituents of the signal generator according to the invention. The oscillator 1 can in an advantageous manner, be constituted by an oscillator generating pulses at 2 MHz of the series CEPE OM 16, the first divider 2 by for example a 16 bits divider and the second divider 3 can be constituted by a first divider with adjustable gain 2A,30, followed by a 16 bits divider. The first and second integrator counters 4,5, can similarly consist of 16 bits counters. A 4 bits counter 6 permits adjustment of the adjustable divider 30. An auxiliary divider 12, a divider by two for example, permits in conjunction with the adjustable divider 30 the obtaining of a ratio of division ratios corresponding to non integer values.

Further, as shown in FIG. 2, the signal generator according to the invention can also comprise, in an advantageous manner, a comparison loop for the value of instantaneous frequency FS of the output signal, namely a numeric comparator 7, to a threshold value delivered by a programmable control generator 8. Similarly the initial value No of the first integrator 4 is delivered by a programmable numeric/initial value control generator 9. The control generators 8 and 9 can be programmed from code wheels 10 or from any other means. In particular, a micro-computer can be used. The comparison loop permits on positive comparison of the value of the instantaneous frequency FS, to the threshold or control value, a reset-up of the system.

Further, as will be described below in the description in a more detailed manner, the output at the frequency FS can be connected to a sinusoidal signal generator 11, three-phase for example, with a view to use for control of synchronous motors.

In FIG. 3a, is shown a diagram of a signal generator according to the invention more particularly adapted for use in the control of a motor such as a synchronous motor.

As can be noted, the signal generator comprises in this case, further to the elements of FIG. 2, a series of buffer memories 13,14 interconnected by a BUS type connection, a data bus, to a micro-computer for example. Similarly control generators 9,8 and the 4 bits counter 6 can be replaced by buffer memories interconnected to the data BUS Different values of control can then be memorised in the corresponding buffer memories.

The memory 6 memorises the value 2A which permits choice of the power of t or the degree of the polynomial.

This value can be modified during operation, for example for starting with an acceleration linearly crossing then operating at constant acceleration.

The memory 13 memorises the initial value Bo, the memory 9 the value No and the memory 8 the frequency FS or initial control value to be obtained, which is analysed as the speed to be obtained by the motor. This control value can be modified at any instant.

The memory 14 memorises whatever are the control orders, such as blocking of the signal generator at the value of the output D1, the first 4 and second 5 integrators being set up. For the complementary value of D1, $\overline{D1}$ the signal generator is unblocked and the output frequency FS rises towards the frequency and final value determined by the control value C.

The circuit 15 permits addressing of different memories.

In FIG. 3b there is shown a control law for speed of a synchronous motor. The curve A is drawn with $\alpha=1$ as far as the end of the plot, the curve B is drawn with $\alpha=2$ as far as the point M, it is superimposed on the curve A. At point M, it changes from $\alpha=2$ to $\alpha=1$ with a discontinuity of slope.

In FIG. 3c, there has been shown a synchronous motor control with a speed rise on an S curve. The part of the curve designated $\gamma1$, for $\alpha=2$, corresponds to a linear acceleration of the type $\gamma=\gamma ot$. The part of the curve designated $\gamma2$ corresponds to a constant acceleration $\gamma2$=constant for $\alpha=1$. The part of the curve designated $\gamma3$ corresponds for $\alpha=0.5, 0.4 \ldots$ to a programmed deceleration.

In FIG. 3d, there is last been shown a variation law for speed of a synchronous motor controlled in rise and fall according to a function of the type $n=\pm Kt$.

In FIGS. 3b, 3c, 3d, the abscisse axis is divided into units of time, in seconds, and the ordinate axis in number of turns per second.

Second Variant

Another variant of the embodiment of the signal generator according to the invention will now be described in connection with FIG. 4.

In this Figure it will be noted that the signal generator part of the device is identical to the diagram of FIG. 1. Further, for generating a sinusoidal form of wave at variable frequency according to a time polynomial variation law, the device comprises further, connected to the output of the first frequency divider 2 with a controlled division ratio, a bistable circuit 40 permitting generation from an output signal at frequency FS a rectangular signal for example at the same instantaneous frequency. Further, a harmonic frequency filter 41 is tuned to the fundamental frequency of the rectangular signal and permits delivery of a signal of which the frequency corresponds to the first harmonic of the rectangular signal.

In the mentioned use, the generator device according to the invention can advantageously find application to frequency generator circuits for radar with frequency agility, to systems for sending coded transmissions.

In this case of course, as a function of the transmission band chosen, the terminal circuits can be in accordance with TTLS or ECL technology for example.

Second Embodiment

Another advantageous embodiment of the generator device according to the invention will now be described in connection with FIGS. 5a and 5b in the case of control of stepper motors.

In this use, a speed control curve is used, a curve such as shown in FIG. 5b for example.

In FIG. 5a, the signal generator according to the present invention comprises substantially the same elements as the signal generator shown in FIG. 3a for example so far as concerns the elements 13,9,8,14 and 15.

Further, the step number control is memorised in the buffer memory 18 and a total step counter 17 is set up on starting with this number of steps, as the buffer memory 18. The direction of rotation of the motor is controlled by any control D3 delivered by the memory 14, the control acting directly at the level of a commutuation circuit 22 delivering a corresponding signal I+, I−. The frequency output FS is divided by two. A step counter with a stable frequency 16 is further provided. Thanks to two counters 16 and 17 and to a buffer 18 which memorises the control value P, the curve is correctly described. At set-up, the counters 16 and 17 are loaded with the value P. The discrete variable D1 memorised in 14 loads the bistable 19 which unblocks the system. The output frequency FS increases in accordance with the programmed slope No, the counters 16,17 counting down to their initial value the pulses seen in FS. When the maximum speed is obtained, the comparator 7 indicates the equality and loads the bistable 20 which blocks the counter 16. The counter 17 continues to count down the pulses until it passes to zero, this point corresponding to a point of symmetry of the curve. The counter 17 is then reloaded with the control value P, the bistable 20 is unloaded, the counter 16 is unblocked, its contents representing the number of pulses remaining a constant frequency. When the contents of the counter 16 passes zero, the sign S is inverted and the frequency is set to decrease according to the programmed slope. When the counter 17 passes zero again, the bistable 19 is unloaded and the system is blocked until a new control signal. The discrete variable D2 permits placing at control speed.

There has thus been described a signal generator with variable frequency with high performance of which the diversity of applications shows the interest. The embodiment described of the device according to the invention in wired logic is in no way limitative. On the contrary, the signal generator can in a very advantageous manner be provided in the form of an integrated circuit, at least as concerns the generator part as such.

In this case, the integrated circuit can advantageously be arranged in a manner to constitute a peripheral circuit of a microprocessor or of a central unit of a microcomputer.

I claim:

1. A signal generator with variable frequency programmable according to a time-polynomial variation law, comprising:
   a reference oscillator for generating a reference signal at an arbitrary frequency (FHL),
   a first frequency divider with a controlled division ratio (N), said first frequency divider receiving said arbitrary frequency reference signal (FHL) and delivering in use an instantaneous frequency output signal (FS),
   a control chain for said first frequency divider fed by said reference oscillator and comprising, connected in cascade, a second frequency divider with a controlled division ratio and a first programmable integrator system of which the output delivers to said first frequency divider the value of said instantaneous division ratio (N),
   a control chain for said second frequency divider comprising a second integrator system receiving said output signal (FS) and delivering said instantaneous division ratio to said second frequency divider with a controlled division ratio, said first and second integrator systems carrying out a magnitude integration at a sign (S) opposite to their input signals, said output signal (FS) having an instantaneous frequency of the polynomial form $$FS = \sum_{j=0}^{n} Kj t^j.$$

2. A device according to claim 1, wherein said first and second integrator systems are constituted by up and down pulse counters.

3. A device according to claim 1, including an adjustable circuit means coupled to said first and second frequency dividers and wherein said first and second frequency dividers with controlled division ratios are adjusted by said adjustable circuit means.

4. A device according to claim 1, wherein said first and second frequency dividers with controlled division ratios include at least one adjustable circuit divider.

5. A device according to claim 1, wherein said first and second integrator systems carry out magnitude integration at the sign (S) of their input signals permitting, as a function of the choice of said sign (S), a change of said polynomial variation law for said output frequency (FS) by values respectively increasing and decreasing said variable frequency as a function of time.

6. A device according to claim 1, further comprising a comparison loop for said value of said instantaneous frequency (FS) of said output signal with a programmable threshold value, said comparison loop permitting on positive comparison of said value of instantaneous frequency (FS) with said threshold value a resetting of said system.

7. A device according to claim 1, wherein in order to generate a sinusoidal wave form at variable frequency according to a time-polynomial variation law, said device further comprises, connected to an output of said first frequency divider with a controlled division ratio, a bistable circuit permitting generation from said output signal at frequency (FS) a rectangular signal of the same instantaneous frequency, a harmonic frequency filter tuned to a fundamental frequency of said rectangular signal connected to an output of said bistable circuit for delivering a signal, the frequency of which corresponds to the first harmonic of said rectangular signal.

8. A device according to claim 1, wherein it is provided in the form of an integrated circuit.

9. Use of a variable frequency signal generator according to claim 1, for control of motors, wherein control parameters are memorised in auxiliary memories interconnected by a BUS type connection to a microcomputer.

10. Use according to claim 9, wherein in order to control a stepper motor, a speed control law for the motor is used, said speed control law employing counting of the total number of steps made, counting of the maximum frequency of steps, control in rising and fall of speed of said stepper motor being carried out by changing the sign of said integrator systems.

11. A device according to claim 1, wherein said reference oscillator is a pulse generator at a quartz-controlled, fixed recurrence frequency.

12. A device according to claim 11, wherein said second frequency divider comprises, connected in cascade, a first frequency divider circuit with a determined adjustable division ratio (A) and a second frequency divider circuit with a controlled division ratio (B).

13. A device according to claim 11, wherein said instantaneous frequency (FS) of said output signal is defined as the reciprocal of the time separating two pulses delivered by said first frequency divider.

14. A device according to claim 12, wherein said first frequency divider circuit with an adjustable division ratio (A) is a programmable divider controlled by an integrator circuit from a reference value, said control of the value of said division ratio A permitting continuous modification of the polynomial variation law for said variable frequency as a function of time.

* * * * *